(12) United States Patent
Yabuuchi

(10) Patent No.: US 9,443,575 B2
(45) Date of Patent: Sep. 13, 2016

(54) SEMICONDUCTOR MEMORY

(71) Applicant: RENESAS ELECTRONICS CORPORATION, Kanagawa (JP)

(72) Inventor: Makoto Yabuuchi, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 105 days.

(21) Appl. No.: 14/502,660

(22) Filed: Sep. 30, 2014

(65) Prior Publication Data
US 2015/0098268 A1 Apr. 9, 2015

(30) Foreign Application Priority Data
Oct. 4, 2013 (JP) .................................. 2013-208760

(51) Int. Cl.
*G11C 11/418* (2006.01)
*G11C 11/419* (2006.01)
*G11C 7/24* (2006.01)
*G11C 8/16* (2006.01)

(52) U.S. Cl.
CPC ............ *G11C 11/419* (2013.01); *G11C 11/418* (2013.01); *G11C 7/24* (2013.01); *G11C 8/16* (2013.01)

(58) Field of Classification Search
CPC ......... G11C 7/22; G11C 8/18; G11C 7/1075; G11C 8/16
USPC ........................................................ 365/154
See application file for complete search history.

(56) References Cited

U.S. PATENT DOCUMENTS

| | | | | |
|---|---|---|---|---|
| 5,384,734 A * | 1/1995 | Tsujihashi | ................ | G11C 8/16 365/189.04 |
| 6,181,634 B1 * | 1/2001 | Okita | ................... | G11C 7/1045 365/189.04 |
| 6,473,357 B1 * | 10/2002 | Fan | ........................ | G11C 8/16 365/154 |
| 6,873,565 B1 * | 3/2005 | Riedlinger | .......... | G11C 11/4125 365/154 |
| 7,054,217 B2 * | 5/2006 | Yamada | ................ | G11C 11/412 365/154 |
| 7,161,845 B2 * | 1/2007 | Hsieh | ....................... | G11C 8/10 257/E27.098 |
| 7,184,359 B1 * | 2/2007 | Bridgewater | ............ | G11C 8/16 365/154 |

(Continued)

FOREIGN PATENT DOCUMENTS

| | | | |
|---|---|---|---|
| DE | EP 2230793 A2 * | 9/2010 | ............. G06F 21/10 |
| JP | 2012-509039 A | 4/2012 | |

OTHER PUBLICATIONS

"FPGA Intrinsic PUFs and Their Use for IP Protection", in Cryptographic Hardware and Embedded Systems—CHES 2007, J. Guajardo, S. S. Kumar, G.-J. Schrijen, and P. Tuyls, ser. LNCS, P. Paillier and I. Verbauwhede, Eds., vol. 4727, Springer, Sep. 10-13, 2007, pp. 63-80.*

*Primary Examiner* — Hoai V Ho
*Assistant Examiner* — Roberto Mancera
(74) *Attorney, Agent, or Firm* — McDermott Will & Emery LLP

(57) ABSTRACT

The disclosed invention provides an SRAM capable of stably generating a PUF-ID without having to be powered on/off under control. The SRAM including a plurality of write ports is provided with a plurality of word lines, each transferring write data from each of the write ports to one memory cell. Timing to negate at least two word lines (AWL, BWL), respectively coupled to two write ports, among the word lines is synchronized. Because synchronicity of writing different values to the memory cell is assured, by using a large number of such memory cells, it is possible to stably generate a PUF-ID without power on/off control.

14 Claims, 12 Drawing Sheets

(56) References Cited

U.S. PATENT DOCUMENTS

| | | | | |
|---|---|---|---|---|
| 7,533,222 B2* | 5/2009 | Leung | G11C 7/1075 | 711/149 |
| 7,602,654 B2* | 10/2009 | Yabuuchi | G11C 5/147 | 365/189.11 |
| 7,894,296 B2* | 2/2011 | Lee | G11C 8/16 | 365/189.04 |
| 7,940,599 B2* | 5/2011 | Lu | G11C 8/10 | 365/189.04 |
| 8,590,010 B2* | 11/2013 | Fainstein | G06F 21/44 | 324/649 |
| 8,699,714 B2 | 4/2014 | Tuyls et al. | | |
| 8,767,445 B2* | 7/2014 | Chellappa | G11C 11/413 | 365/154 |
| 9,038,133 B2* | 5/2015 | Chellappa | G06F 21/44 | 726/2 |
| 9,046,573 B1* | 6/2015 | Watt | G06F 17/5045 | |
| 9,208,856 B2* | 12/2015 | Pelley | G11C 11/418 | |
| 2005/0270885 A1* | 12/2005 | Masuo | G11C 8/16 | 365/230.05 |
| 2009/0052262 A1* | 2/2009 | Nii | G11C 8/08 | 365/189.14 |
| 2010/0097843 A1* | 4/2010 | Bardouillet | G11C 14/00 | 365/148 |
| 2012/0230087 A1* | 9/2012 | Chellappa | G11C 11/413 | 365/154 |
| 2013/0051552 A1* | 2/2013 | Handschuh | G06F 21/602 | 380/44 |
| 2014/0070212 A1* | 3/2014 | Fujiwara | G06K 19/0722 | 257/48 |
| 2014/0191338 A1* | 7/2014 | Nii | H01L 27/0207 | 257/401 |
| 2015/0008763 A1* | 1/2015 | Kuenemund | H03K 3/84 | 307/115 |
| 2015/0355886 A1* | 12/2015 | Peeters | G06F 7/588 | 708/250 |

* cited by examiner

SEMICONDUCTOR MEMORY

CROSS-REFERENCE TO RELATED APPLICATIONS

The disclosure of Japanese Patent Application No. 2013-208760 filed on Oct. 4, 2013 including the specification, drawings and abstract is incorporated herein by reference in its entirety.

BACKGROUND

The present invention relates to a semiconductor memory and, particularly, the invention can suitably be used for a multi-port SRAM (Static Random Access Memory) that is capable of generating a physically unclonable function.

Various security threats/attacks to LSIs (Large Scale Integrated circuits) of microcomputers or the like, such as fraudulent access to them, their fraudulent imitations, and others, are reported. To protect the LSIs of microcomputers or the like and systems equipped with the LSIs against such attacks, a security technology using a device unique identifier PUF-ID (Physically Unclonable Function Identification), which leverages a function that is physically irreproducible, is developed.

In Patent Document 1, there are disclosed a technique that generates a PUF-ID using a memory and a technique that enhances resistance to physical attacks by means of a PUF generated using a memory. This technique generates a device unique PUF-ID as a cipher key by acquiring multiple values from multiple memory locations in one or more memories and reordering them. In the case of a SRAM memory, initial state values after the SRAM is powered on can be used to construct a PUF-ID. It is also described that a dual-port RAM is used and, by writing different pieces of data through both ports at the same time, memory cells exhibit a PUF-like behavior (paragraphs [0008] and [0043] in the same document).

RELATED ART DOCUMENT

Patent Document

[Patent Document 1] Japanese Translation of PCT International Application Publication No. JP-T-2012-509039

SUMMARY

The present inventors examined the techniques set forth in Patent Document 1 and, as a result, found emerging problems as will be described below.

In the case of using SRAM initial values to generate a PUF-ID, there is a problem in which usage of the SRAM is restricted. To make SRAM initial values available, the SRAM has to be powered on when it has been discharged completely after powered off. Thus, the SRAM cannot be used during an interval of several microseconds (μs) before it is powered on. This problem is addressed as follows. In an LSI equipped with an SRAM, a power switch is provided that can power the SRAM on/off independently of other circuits. While keeping circuits other than the SRAM operating, by powering the SRAM off once and then powering it on again, it is possible to regenerate a PUF-ID repeatedly. However, usage of the SRAM is restricted; e.g., data that is stored in the SRAM for use as a PUF has to be saved as necessary because the data becomes volatile by the power-off of the SRAM. Another problem arises; i.e., the power switch for the SRAM brings about an increase in the LSI chip area and, besides, a filter circuit and a guard ring which need to be interpolated to suppress noise introduced by powering the SRAM on/off brings about a further increase in the LSI chip area.

On the other hand, the method in which a dual-port RAM is used and different pieces of data are written through both ports at the same time does not involve the need for powering it on/off and, thus, it is expected that the problems concerning the power switch are solved. But, it turned out that memory cells do not necessarily exhibit a PUF-like behavior even if different pieces of data have been written through both ports on the user level of the memory. Through the analysis of what causes it made by the present inventors, it turned out that, because of differing transmission delays from both ports, a value first arrived at a memory cell is overwritten with a value arrived there later, and this creates a situation where randomness that is required of a PUF is not provided sufficiently.

Means for solving above-noted problems will be described below. Other problems and novel features will become apparent from the following description in the present specification and the accompanying drawings.

According to an embodiment of the invention, a semiconductor memory is provided as below.

A semiconductor memory including a plurality of write ports is provided with a plurality of word lines, each transferring write data from each of the write ports to one memory cell, and configured to be able to implement control to synchronize timing to negate at least two word lines, respectively coupled to two write ports, among the word lines.

Effect that will be achieved by the foregoing embodiment is briefly described below.

It is possible to provide a semiconductor memory capable of stably generating a PUF-ID without having to be powered on/off under control.

DETAILED DESCRIPTION

1. General Outline of Embodiments

Figure 1:
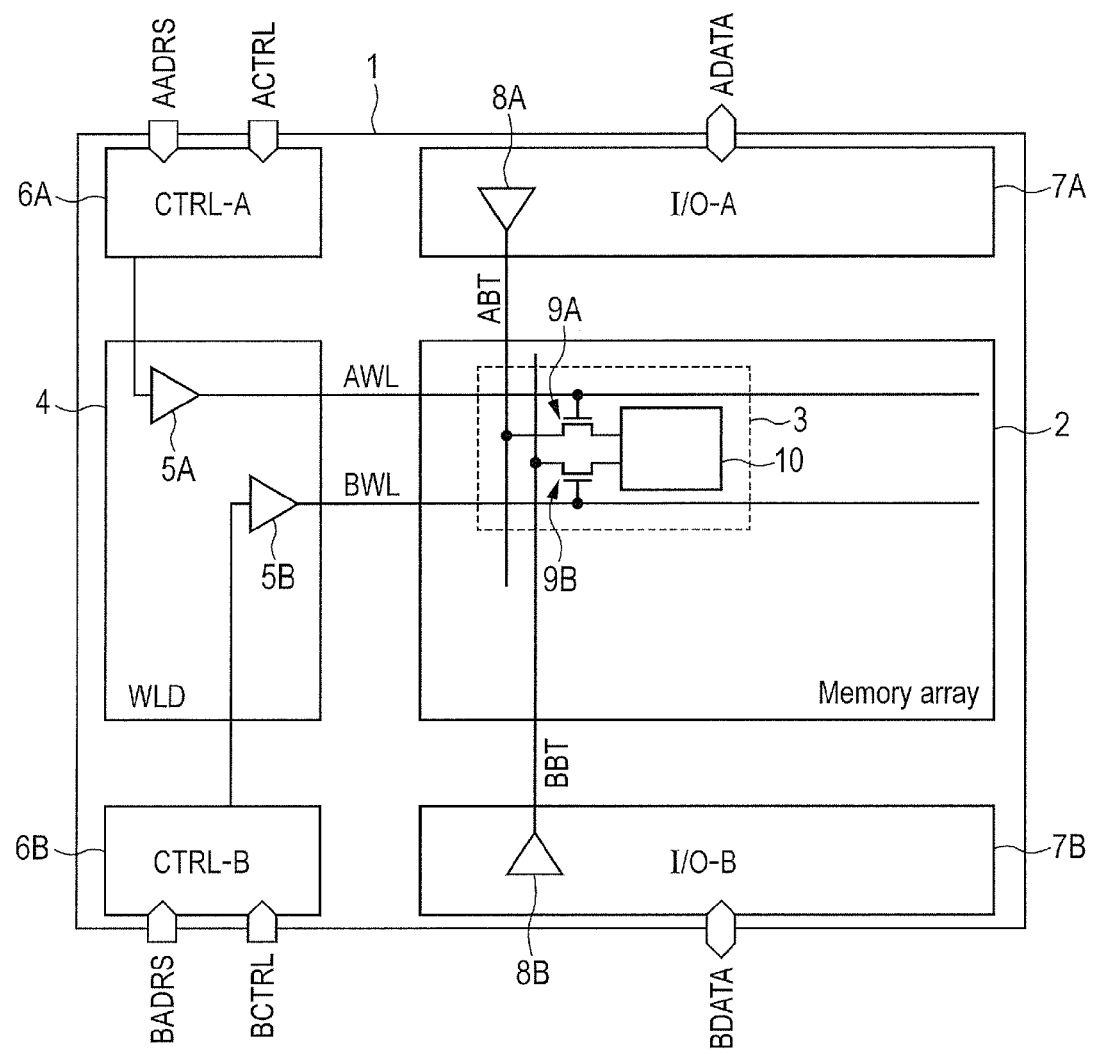
FIG. 1 is an outline block diagram of a semiconductor memory pertaining to a first embodiment.

To begin with, exemplary embodiments of the present invention disclosed herein are outlined. In the following general description of exemplary embodiments, reference designators (numerals)) in the drawings, which are given for referential purposes in parentheses, are only illustrative of elements that fall in the concepts of the components identified by the designators.

[1] <Synchronizing Timing to Negate Two Word Lines for SRAM-PUF Implementation>

A semiconductor memory (1) includes memory cells (2) and a plurality of write ports for writing data to the memory cells. The plurality of write ports comprise a plurality of word lines for specifying a write to the memory cell, respectively. The semiconductor memory is configured to allow the control for synchronizing the timing to negate of two word lines AWL, BWL among the plurality of word lines.

Thereby, it is possible to provide a semiconductor memory capable of stably generating a PUF-ID without having to be powered on/off under control.

[2] <Switching Between a Normal Operation and a PUF-ID Generating Operation>

The semiconductor memory, as set forth in section [1], has a normal operation mode and a PUF-ID generation mode. The semiconductor memory is configured such that: in the normal operation mode, writing data from the write ports to each of the memory cells can be performed in a mutually asynchronous manner; and, in the PUF-ID generation mode, control to synchronize timing to negate the two word lines can be implemented.

Thereby, switching between a normal operation and a PUF-ID generating operation can be controlled according to operation mode.

[3] <Clock Switching>

To the semiconductor memory, as set forth in section [2], normal operation clocks (ACLK, BCLK) are respectively input to each of the write ports and a clock for PUF-ID generation (IDCLK) is further input. The semiconductor memory is configured such that: in the normal operation mode, writing data from the write ports to each of the memory cells can be controlled to be performed in sync with each of the normal operation clocks at each port side; and, in the PUF-ID generation mode, both the two word lines can be controlled in sync with the clock for PUF-ID generation.

Thereby, it is possible to easily synchronize timing to negate the two word lines in order to generate a PUF-ID in a multi-port memory in which the respective ports operate in sync with mutually asynchronous clocks.

[4] <Address and Control Signal Switching>

To the semiconductor memory, as set forth in section [2], an address (AADRS, BADRS) and a control signal (ACTRL, BCTRL) are input to each of the write ports. The semiconductor memory is configured such that: in the normal operation mode, the two word lines can be controlled separately depending on an address and a control signal that are input to each of the write ports to which the word lines are coupled respectively; and, in the PUF-ID generation mode, both the two word lines can be controlled depending on an address and a control signal that are input to one of the write ports.

Thereby, it is possible to easily synchronize timing to negate the two word lines in order to generate a PUF-ID in a multi-port memory in which the respective ports operate independently from each other.

[5] <Short-Circuiting Two Word Lines>

The semiconductor memory, as set forth in section [4], further includes a switch (16) for mutually short-circuiting the two word lines in the PUF-ID generation mode.

Thereby, synchronizing the two word lines can be performed easily and surely.

[6] <Address Decode Signal Switching>

The semiconductor memory, as set forth in section [4], includes, in each of two write ports to which the two word lines are coupled respectively, an address decoder (15A, 15B, 26A, 26B) for decoding an address that is input to each write port and a drive circuit (5A, 5B) for driving one of the two word lines, which is coupled to the corresponding write port, depending on an output of the address decoder in the normal operation mode. The semiconductor memory includes switching circuits (25_1 thru 25_6) to replace decoding results of one address decoder by decoding results of the other address decoder in the PUF-ID generation mode.

Thereby, synchronizing the two word lines can be performed easily and surely.

[7] <Pre-Decode Signal Switching>

The address decoder included in each of the two write ports to which the two word lines are coupled respectively, as set forth in section [6], is configured including a pre-decoding circuit (15A, 15B) that decodes an input address and a post-decoding circuit (26A, 26B) that takes input of pre-decoding results of the pre-decoding circuit and is able to generate a signal to control one of the word lines, which is coupled to the corresponding write port. The switching circuits are configured to enable inputting of pre-decoding results of the pre-decoding circuit to its associated post-decoding circuit (26A, 26B) in the normal operation mode and inputting of pre-decoding results of one address decoder to both the associated post-decoding circuit (26A) and the post-decoding circuit (26B) of the other address decoder in the PUF-ID generation mode.

Thereby, the total size of circuits to be added to the semiconductor memory in order to stably generate a PUF-ID can be reduced.

[8] <Automatically Generating Write Data>

In the semiconductor memory, as set forth in any one of sections [2] thru [7], write data (ADATA, BDATA) is input to each of the write ports.

The semiconductor memory is configured such that respective pieces of the write data can be written to the memory cells from the write ports in the normal operation mode. The semiconductor memory further includes a circuitry for switching write data (27, 28) to enable, in the PUF-ID generation mode, inputting of two pieces of data, one having bits and the other having their inverse bits, to two write ports to which the two word lines are coupled respectively among the write ports, instead of write data that is respectively written to each write port.

Thereby, it is possible to eliminate a need for externally supplying write data in the PUF-ID generation mode.

[9] <Synchronizing Timing to Negate Two Word Lines for SRAM-PUF Implementation>

A semiconductor memory (1) includes a first port to which a first address (AADRS) is input, a second port to which a second address (BADRS) is input, and a memory array (2) which includes a plurality of memory cells (3) and is configured as follows.

Each of the memory cells includes a first switch (9A), a second switch (9B), and a storage element (10) and is coupled to a first word line (AWL), a second word line (BWL), a first bit line (ABT), and a second bit line (BBT). The first switch is configured to be able to transfer a signal incoming over the first bit line to the storage element when the first word line has been asserted and the second switch is configured to be able to transfer a signal incoming over the second bit line to the storage element when the second word line has been asserted.

The semiconductor memory is configured to be able to implement control, after both a first word line (AWL) and a second word line (BWL) coupled to a same memory cell are asserted, to synchronize timing to negate the first word line and timing to negate the second word line.

Thereby, it is possible to provide a semiconductor memory capable of stably generating a PUF-ID without having to be powered on/off under control.

[10] <PUF-ID Generate Command Signal (IDGEN)>

The semiconductor memory, as set forth in section [9], takes input of a generate command signal (IDGEN) and is configured to be able to implement control to synchronize timing to negate the first word line and timing to negate the second word line when the generate command signal is asserted.

Thereby, switching between a normal operation and a PUF-ID generating operation can be controlled by the PUF-ID generate command signal (IDGEN).

[11] <Clock Switching>

In the semiconductor memory, as set forth in section [10], a first clock (ACLK) is further input to the first port, a second clock (BCLK) is further input to the second port, and a third clock (IDCLK) is further input.

When the generate command signal is not asserted, the first port operates in sync with the first clock and implements control to assert and negate the first word line and the second port operates in sync with the second clock and implements control to assert and negate the second word line.

When the generate command signal is asserted, both the first port and the second port operate in sync with the third clock so as to be able to implement control to assert and negate the first word line and the second word line concurrently.

Thereby, it is possible to easily synchronize timing to negate the two word lines in order to generate a PUF-ID in a multi-port memory in which the respective ports operate in sync with mutually asynchronous clocks.

[12] <Short-Circuiting Two Word Lines>

The semiconductor memory, as set forth in section [10], includes a first drive circuit (5A) in the first port and includes a second drive circuit (5B) in the second port.

When the generate command signal is not asserted, the first word line is driven by the first drive circuit and the second word line is driven by the second drive circuit.

When the generate command signal is asserted, both the first word line and the second word line are driven by the first drive circuit.

Thereby, synchronizing timing to negate the two word lines can be performed easily and surely to generate a PUF-ID in a multi-port memory in which the respective ports operate independently from each other.

[13] <Driving Circuits for Both Word Lines are Driven by a Control Circuit in One of the Two Ports>

In the semiconductor memory, as set forth in section [10], the first port includes a first control circuit (6A) and a first drive circuit (5A) and the second port includes a second control circuit (6B) and a second drive circuit (5B).

When the generate command signal is not asserted, the first control circuit supplies first decoding results of decoding the first address to the first drive circuit and the first drive circuit drives the first word line depending on the first decoding results. Also, the second control circuit supplies second decoding results of decoding the second address to the second drive circuit and the second drive circuit drives the second word line depending on the second decoding results.

When the generate command signal is asserted, the first control circuit supplies first decoding results of decoding the first address to the first drive circuit and the second drive circuit. Then, the first drive circuit drives the first word line the depending on the first decoding results and the second drive circuit drives the second word line depending on the first decoding results.

Thereby, it is possible to easily synchronize timing to negate the two word lines in order to generate a PUF-ID in a multi-port memory in which the respective ports operate independently from each other.

[14] <Pre-Decode Signal Switching>

In the semiconductor memory, as set forth in section [13], the first control circuit includes a first pre-decoding circuit (15A) that pre-decodes the first address and outputs first pre-decoding results and a first post-decoding circuit (26A) that drives the first drive circuit. The second control circuit includes a second pre-decoding circuit (15B) that pre-decodes the second address and outputs second pre-decoding results and a second post-decoding circuit (26B) that drives the second drive circuit.

When the generate command signal is not asserted, the first pre-decoding results are supplied to the first post-decoding circuit and the second pre-decoding results are supplied to the second post-decoding circuit.

When the generate command signal is asserted, the first pre-decoding results are supplied to the first post-decoding circuit and the second post-decoding circuit.

Thereby, the total size of circuits to be added to the semiconductor memory in order to stably generate a PUF-ID can be reduced.

[15] <Automatically Generating Write Data>

In the semiconductor memory, as set forth in any one of sections [10] thru [14], first write data (ADATA) is input to the first port and second write data (BDATA) is input to the second port.

The semiconductor memory is configured such that the first write data can be written to the memory cells from the first port and the second write data can be written to the memory cells from the second port.

The semiconductor memory further includes a circuitry for generating write data (27, 28) to fix the first write data to a string of predetermined bits and fix the second write data to a string of bits inverse to the values of bits of the string of predetermined bits in the PUF-ID generation mode.

Thereby, it is possible to eliminate a need for externally supplying write data in the PUF-ID generation mode.

2. Details on Embodiments

Embodiments of the invention will then be described in greater detail.

First Embodiment

<Synchronizing Timing to Negate Two Word Lines for SRAM-PUF Implementation>

FIG. 1 is an outline block diagram of a semiconductor memory 1 pertaining to a first embodiment. The semiconductor memory 1 has a memory array 2 comprised of a plurality of memory cells 3, a word line driver (WLD) 4 including word line driving circuits 5A, 5B, and two write ports. Of the semiconductor memory 1, one port (referred to as "port A") is equipped with a controller (CTRL-A) 6A and an I/O unit (I/O-A) 7A to which an address AADRS, a control signal ACTRL, and data ADATA are input, and the other port (referred to as "port B") is equipped with a controller (CTRL-B) 6B and an I/O unit (I/O-B) 7B to which an address BADRS, a control signal BCTRL, and data BDATA are input. Although not restrictive, each of the addresses AADRS and BADRS and the data ADATA and BDATA is comprised of a plurality of bits. The control signals ACTRL and BCTRL each may also be comprised of a plurality of particular control signals such as, e.g., chip select CS, write enable WE, and read RD/WT.

The memory array 2 is comprised of a plurality of memory cells 3 arrayed in multiple columns and rows. In the memory array 2, arrayed horizontally are memory cells 3 as many as the number of bits that can be written in parallel at the same time and arrayed vertically are memory cells 3 as many as the number of rows corresponding to the number of words. However, FIG. 1 depicts only one memory cell 3 and other ones are omitted from depiction. Each of the memory cells 3 includes switches 9A and 9B and a storage element 10 and is coupled to word lines AWL and BWL and bit lines ABT and BBT. A switch 9A transfers a signal incoming over a bit line ABT to the storage element 10 when a word line AWL has been asserted. A switch 9B transfer a signal incoming over a bit line BBT to the storage element 10 when a bit line BBT has been asserted. An address AADRS that is input to port A is decoded by the controller 6A and one word is selected. A word line corresponding to the one word thus selected is driven by the appropriate driving circuit in the word line driver. As an example hereof, one word line driving circuit 5A and one word line AWL are depicted in FIG. 1. Similarly, an address BADRS that is input to port B is decoded by the controller 6B and one word is selected. A word line corresponding to the one word thus selected is driven by the appropriate driving circuit in the word line driver. As an example hereof, one word line driving circuit 5B and one word line BWL are depicted in FIG. 1. According to a value of data ADATA inputted to port A, the bit line ABT is driven by a bit line driving circuit 8A. When the word line AWL is asserted to turn the switch 9A on, a value incoming over the bit line ABT is transferred to the storage element 10. Similarly, according to a value of data BDATA inputted to port B, the bit line BBT is driven by a bit line driving circuit 8B. When the word line BWL is asserted to turn the switch 9B on, a value incoming over the bit line BBT is transferred to the storage element 10.

In a normal operation mode, the semiconductor memory 1 functions as a dual-port memory. Control to avoid contention between writing of data from port A and writing of data from port B is performed by, for example, an arbitration circuit. By contrast, in the present embodiment, different values from the two ports are written into one storage element and this makes the storage element behave so that a value that is actually stored into the storage element is determined by variation specific to the semiconductor element itself and function as a PUF.

Figure 2:
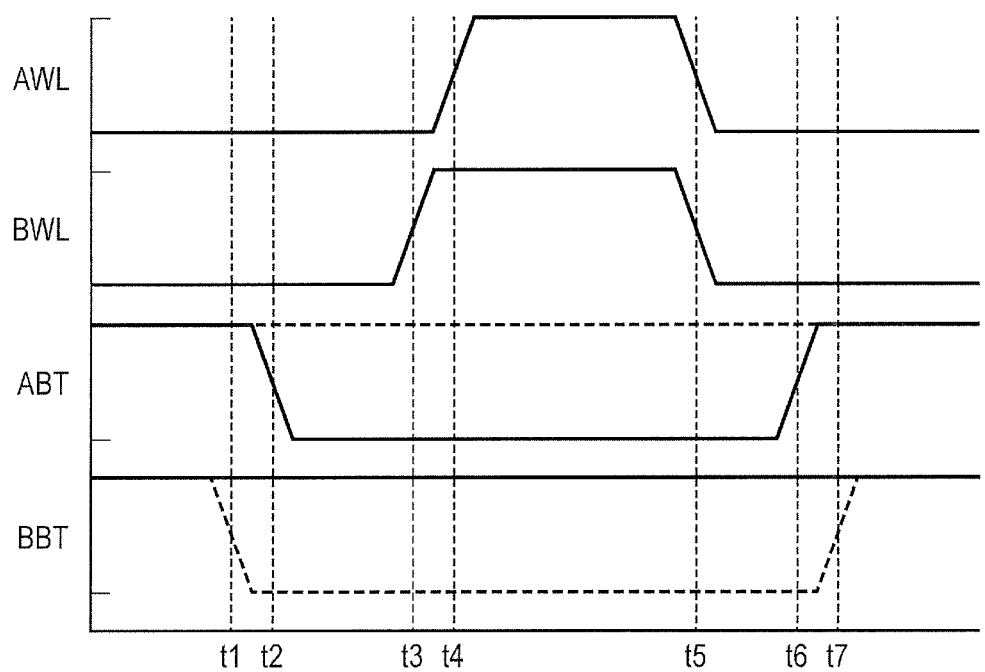
FIG. 2 is a timing chart representing operation of the semiconductor memory pertaining to the first embodiment.

FIG. 2 is a timing chart representing operation of the semiconductor memory 1 pertaining to the first embodiment. Time is plotted on the abscissa and the waveforms representing the states of the word lines AWL and BWL and the bit lines ABT and BBT are presented in top-to-bottom order along the ordinate. In an initial state, both the word lines AWL and BWL are deselected and low and both the bit lines ABT and BBT are, e.g., pre-charged and high. The bit line BBT makes a transition at time t1 and the bit line ABT makes a transition at time t2. In FIG. 2, presented is an example where the bit line ABT is low and the bit line BBT is high. The bit line BBT does not change at time t1 and remains at high, whereas the bit line ABT makes a transition to low at time t2. The word line BWL is asserted to make a transition to high at time t3 and the word line AWL is asserted to make a transition to high at time t4. Both the word lines AWL and BWL are simultaneously negated to make a transition to low at time T5. Then, both the bit lines ABT and BBT return to high, i.e., pre-charged state at time t6 and time t7. Although the bit lines ABT and BBT make a transition at different timings t1 and t2 and timings t6 and t7, the bit lines ABT and BBT may make a transition simultaneously. Also, the word lines AWL and BWL which are asserted at different timings t3 and t4 may be asserted (rise) simultaneously. For a period from time t4 to time t5, the storage element 10 is driven to low level through the bit line ABT and via the switch 9A and, at the same time, driven to high level through the bit line BBT and via the switch 9B. Because the storage element 10 is driven to opposite levels, its storage state is unstable during this period. The switches 9A and 9B are turned off simultaneously at time t5 to place the storage element 10 into a non-driven state. Then, the storage element 10 makes a transition to a state that is determined by variation specific to the device itself and becomes stable. If the turn-off timing of either of the switches 9A and 9B delays, a period occurs in which, after the turn-off of one switch, the other switch remains on. Then, the storage state of the storage element 10 makes a transition to a state that takes place by being driven via the switch remaining on in that period and becomes stable. Therefore, the storage state of the storage element 10 is not settled randomly and cannot be used as a PUF. However, in the present embodiment, by synchronizing timing to negate the two word lines AWL and BWL, the state of the storage element 10 makes a transition to a random state that is determined by variation specific to the device itself and becomes stable. Thus, this behavior can be used as a PUF. In this way, it is possible to provide the semiconductor memory 1 capable of stably generating a PUF-ID without having to be powered on/off under control.

Figure 3:
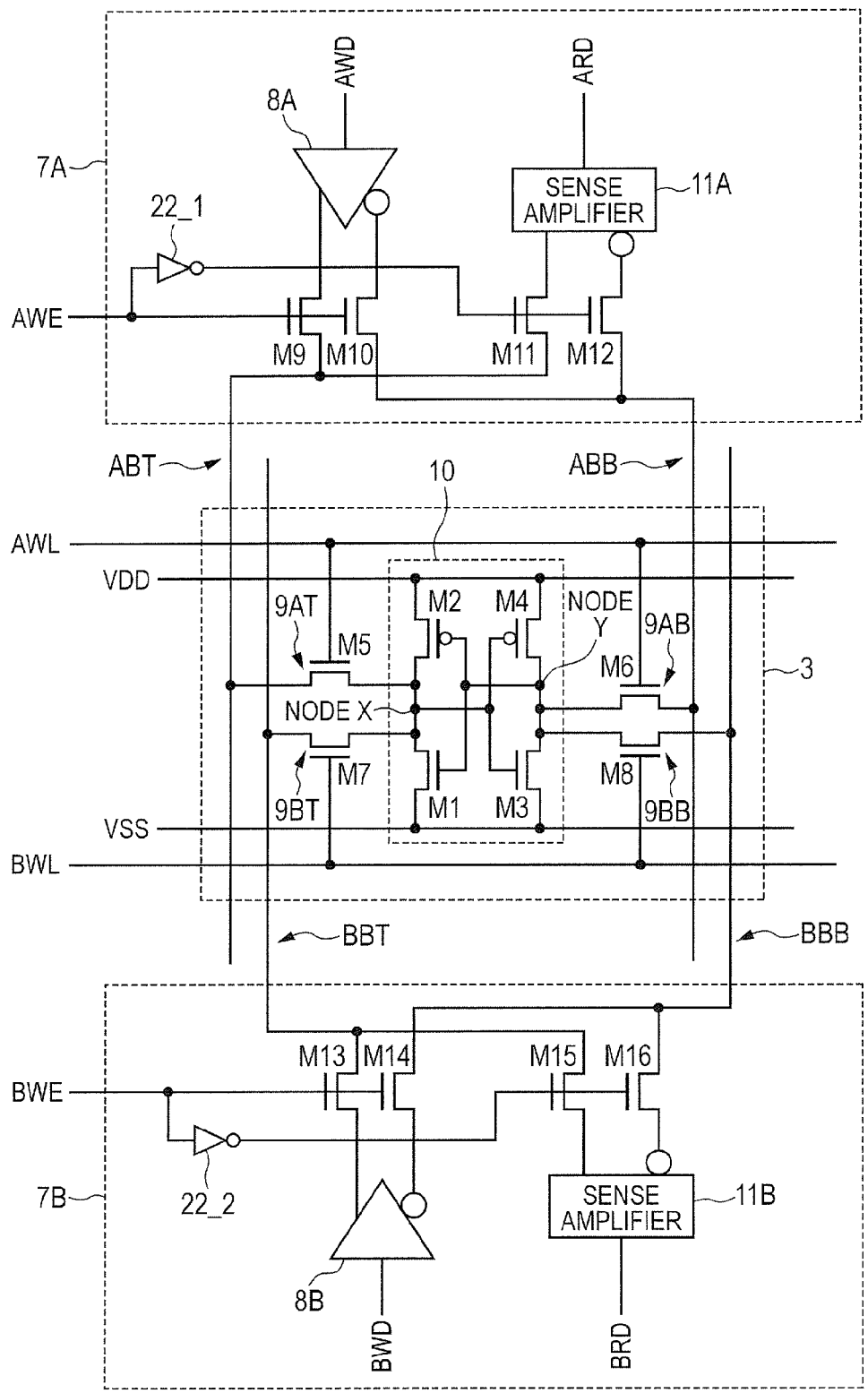
FIG. 3 is a circuit diagram depicting a configuration example of the semiconductor memory.

FIG. 3 is a circuit diagram depicting an example of a more detailed configuration of the semiconductor memory 1. Although not restrictive, the semiconductor memory 1 of the first embodiment can be configured using, for example, CMOS (Complementary Metal Oxide Semiconductor) Field Effect Transistors (FETs). The storage element 10 includes two CMOS inverters, each of which is formed of a pair of CMOSFETs M1 and M2 and a pair of CMOSFETs M3 and M4, and the storage element 10 is configured such that an output of one COMS inverter is coupled to an input of the other CMOS inverter. A node X is an output node for an inverter formed of M1 and M2 and an input node for an inverter formed of M3 and M4. A node Y is an output node for the inverter formed of M3 and M4 and an input node for the inverter formed of M1 and M2. There are transistor switches M5 thru M8 which function as transfer gates 9AT, 9AB, 9BT, 9BB. Transistor switches M5 and M6 are coupled to a word line AWL and control writing of data incoming through complementary bit lines ABT and ABB to the storage element 10. Transistor switches M7 and M8 are coupled to a word line BWL and controls writing of data incoming through complementary bit lines BBT and BBB, respectively, to the storage element 10. The complementary bit lines ABT and ABB are coupled to the bit line driving circuit 8A via transistor switches M9 and M10 and coupled to a sense amplifier 11A via transistor switches M11 and M12. As for the transistor switches M9 and M10 and the transistor switches M11 and M12, when writing is performed, a write enable signal AWE for port A turns the transistor switches M9 and M10 on and the complementary bit lines ABT and ABB are driven by the bit line driving circuit 8A. In the port B side, similarly, the complementary bit lines BBT and BBB are coupled to the bit line driving circuit 8B via transistor switches M13 and M14 and coupled to a sense amplifier 11B via transistor switches M15 and M16. As for the transistor switches M13 and M14 and the transistor switches M15 and M16, when writing is performed, a write enable signal BWE for port B turns the transistor switches M13 and M14 and the complementary bit lines BBT and BBB are driven by the bit line driving circuit 8B. The bit line driving circuit 8A and the sense amplifier 11A are included in the I/O unit (I/O-A) 7A at the port A side. The bit line driving circuit 8B and the sense amplifier 11B are included in the I/O unit (I/O-B) 7B at the port B side. Data ADATA signals at the port A side are bidirectional and are separated into write data AWD which is input to the bit line driving circuit 8A and read data ARD which is output from the sense amplifier 11A by a circuit, which is not depicted, within the I/O unit (I/O-A) 7A. Likewise, data BDATA signals at the port B side are also bidirectional and are separated into write data BWD which is input to the bit line driving circuit 8B and read data BRD which is output from the sense amplifier 11B by a circuit, which is not depicted, within the I/O unit (I/O-B) 7B.

When writing a low level from port A and writing a high level from port B, as is the case presented in FIG. 2, bit line ABT is low, ABB is high, BBT is high, and BBB is low. When the two word lines AWL and BWL are concurrently asserted and turned high, the node X is driven to low level from the bit line driving circuit 8A at the port A side via the transistor switches M9 and M5 and, at the same time, driven to high level from the bit line driving circuit 8B at the port B side via the transistor switches M14 and M7. The other node Y is driven to high level from the bit line driving circuit 8A at the port A side via the transistor switches M10 and M6 and, at the same time, driven to low level from the bit line driving circuit 8B at the port B side via the transistor switches M14 and M8. Because both the node X and the node Y are, at the same time, driven to high and low, i.e., two opposite levels, these nodes do not stabilize to high or low level. The word lines AWL and BWL are negated synchronously and this causes the transistor switches M5, M6, M7, and M8 to turn off simultaneously. The storage element 10 is placed in a state in which it is not driven externally, while the nodes X and Y do not stabilize to high or low level. When the nodes X and Y assume an intermediate value which is neither high nor low, currents flow through both the CMOS inverters formed of M1 thru M4. Depending on which current is larger flowing through which inverter, the nodes X and Y reach a stable state in which one of them is high and the other is low. Which state, high or low, to which each node stabilizes is determined by device-specific process variation such as parasitic resistance and parasitic capacitance as well as the threshold voltages and conductances of the MOS transistors M1 thru M4. By provision of a number of memory cells 3 like this, it is possible to generate a code comprised of a number of bits, determined by device-specific process variation. If such code is comprised of a sufficiently large number of bits, a probability in which some devices create an identical code value can be reduced to an extent that it can be regarded as practically zero and thus such code can be used as a PUF-ID.

Although a dual-port SRAM having two bidirectional ports for read and write was illustrated in FIG. 3, it is possible to provide a semiconductor memory that functions as a SRAM-PUF in the same way, if the semiconductor memory has two write ports. For example, such semiconductor memory may have two write ports and one read port or may have three or more write ports. If having three or more write ports, such semiconductor memory may be configured such that timing to negate word lines coupled to two of those ports can be synchronized. While a CMOS-SRAM was taken as an example, there is no limitation to it. A semiconductor memory using any type of storage elements that can give an even probability in which each node stabilizes to which state, high or low can be made to function as a PUF in the same way. While same descriptions are not duplicated with regard to other embodiments which will be described in the following, the foregoing descriptions are also applicable to other embodiments in similar context.

Second Embodiment

Clock Switching

Descriptions are provided for a configuration example of a circuitry of a semiconductor memory 1 for synchronizing timing to negate two word lines AWL and BWL.

Figure 4:
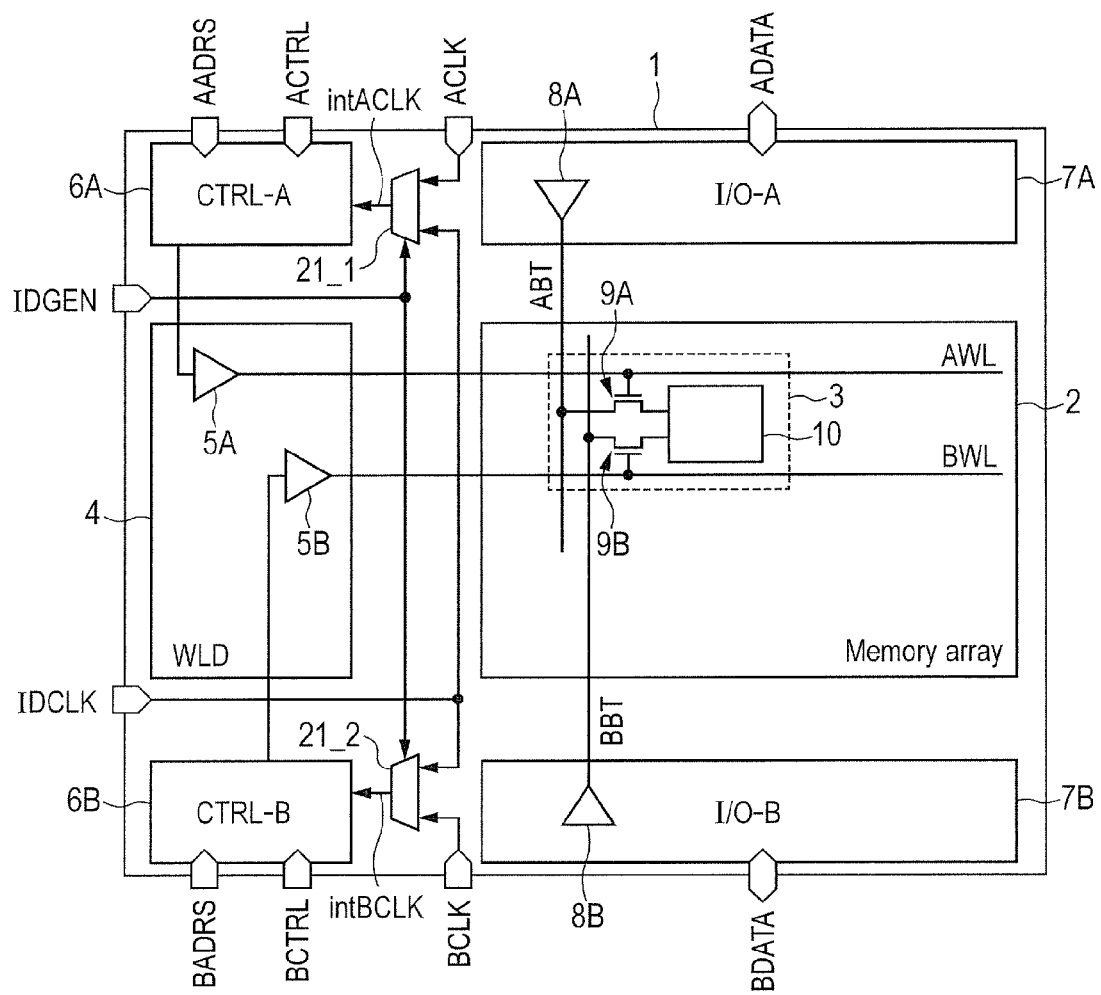
FIG. 4 is an outline block diagram of a semiconductor memory pertaining to a second embodiment.

FIG. 4 is an outline block diagram of a semiconductor memory 1 pertaining to a second embodiment. Differences from the semiconductor memory depicted in FIG. 1 are as follows: normal operation clocks ACLK and BCLK are respectively input to a plurality of write ports; a PUF-ID generate command signal IDGEN and a clock for PUF-ID generation IDCLK are input; and selectors 21_1 and 21_2 for clock switching are provided. Other details of configuration are the same as in the first embodiment described with reference to FIG. 1 and thus description thereof is omitted. The semiconductor memory 1 depicted in FIG. 4 is a dual-port SRAM which is of a clock synchronization type and is configured such that port A operates in sync with a clock ACLK and port B operates in sync with a clock BCLK in the normal operation mode. The clock ACLK and clock BCLK may be purely asynchronous and these clocks with mutually different frequencies and phases may be input. A word line AWL coupled to port A and a word line BWL coupled to port B are asserted and negated asynchronously with respect to each other in the normal operation mode.

The semiconductor memory 1 has a PUF-ID generation mode other than the normal operation mode. And it is configured such that, in the PUF-ID generation mode, it is able to synchronize timing to negate two word lines AWL and BWL. Depending on the PUF-ID generate command signal IDGEN, a switch 21_1 selects a normal operation clock ACLK and outputs it as an internal clock intACLK in the normal operation mode and selects a clock for PUF-ID generation IDCLK and outputs it as the internal clock intACLK in the PUF-ID generation mode. Depending on the PUF-ID generate command signal IDGEN, a switch 21_2 selects a normal operation clock BCLK and outputs it as an internal clock intBCLK in the normal operation mode and selects the clock for PUF-ID generation IDCLK and outputs it as the internal clock intBCLK in the PUF-ID generation mode. Although not depicted, the controller 6A and the I/O unit 7A are configured as synchronous circuits using flip-flop and latch circuits which are driven by the internal clock intACLK and the controller 6B and the I/O unit 7B are configured as synchronous circuits using flip-flop and latch circuits which are driven by the internal clock intBCLK. Because the controller 6A operates in sync with the internal clock intACLK, the word line AWL is synchronous with the internal clock intACLK. Because the controller 6B operates in sync with the internal clock intBCLK, the word line BWL is synchronous with internal clock intBCLK.

In the normal mode, the word lines AWL and BWL make a transition in sync with, respectively, the clocks ACLK and BCLK which are mutually asynchronous and, thus, timings to assert and negate these word lines are mutually asynchronous. In the PUF-ID generation mode, however, these word lines make a transition in sync with the same clock for PUF-ID generation IDCLK and, thus, both timing at which they are asserted and timing at which they are negated are synchronized. Accordingly, synchronizing timing to negate two word lines AWL and BWL can be performed easily to generate a PUF-ID in a multi-port memory in which the respective ports operate in sync with mutually asynchronous clocks. It is thus possible to provide a semiconductor memory capable of stably generating a PUF-ID without having to be powered on/off under control.

For conventional dual-port or multi-port SRAMs, each port is assumed to operate asynchronously and, therefore, skew adjustment in a clock tree is performed respectively and it is not necessarily required to make a design for skew alignment between ports. However, to make the dual-port SRAM of the present embodiment function as a SRAM-PUF, it is preferable that skew adjustment is performed for latency alignment in a clock tree for the internal clocks intACLK and intBCLK. Skew adjustment may be performed in generating a clock tree in a design phase or skews may be automatically compensated by a delay adjustment circuit that is added to the SRAM configuration.

Figure 5:
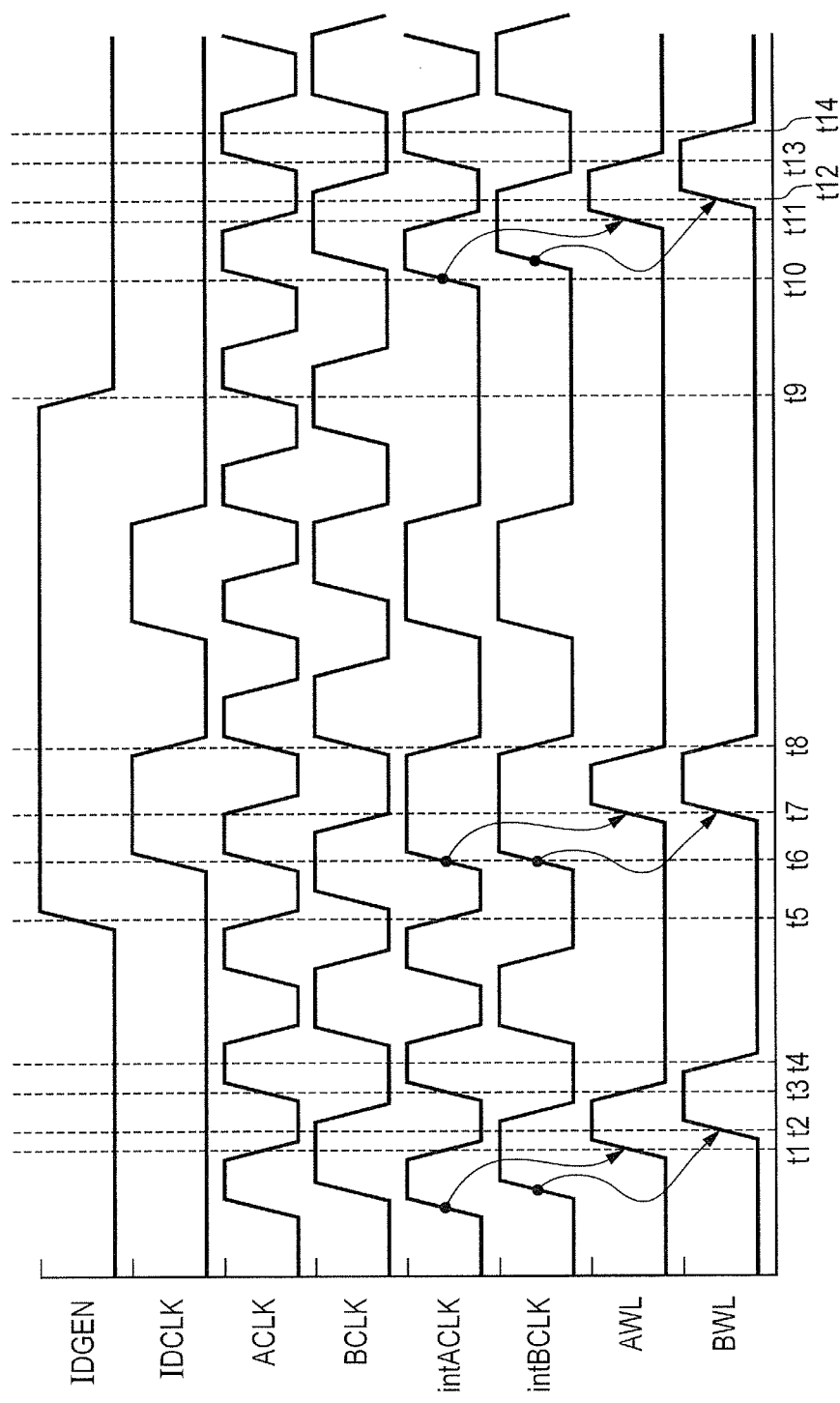
FIG. 5 is a timing chart representing operation of the semiconductor memory pertaining to the second embodiment.

FIG. 5 is a timing chart representing operation of the semiconductor memory pertaining to the second embodiment. Time is plotted on the abscissa and the waveforms representing the states of the PUF-ID generate command signal IDGEN, clock for PUF-ID generation IDCLK, normal operation clocks ACLK と and BCLK, internal clocks intACLK and intBCLK, and word lines AWL and BWL are presented in top-to-bottom order along the ordinate. The memory is placed in the PUF-ID generation mode from time t5 to t8 and in the normal operation mode before the time t5 and after the time t8. The PUF-ID generate command signal IDGEN is low in the normal operation mode and high in the PUF-ID generation mode. The normal operation clocks ACLK and BCLK are asynchronous clocks with mutually different frequencies. In the normal operation mode, the normal operation clock ACLK is supplied as the internal clock intACLK and the word line AWL makes a transition in sync with this clock. That is, the word line AWL is asserted at time t1 after a given delay made by internal circuitry from a rise of the clock ACLK and negated at time t3 after another given delay made by internal circuitry. The AWL is asserted at time t1 in sync with a fall of the clock ACLK and negated at time t3 in sync with a rise of the clock ACLK. On the other hand, the normal operation clock BCLK is supplied as the internal clock intBCLK and the word line BWL makes a transition in sync with this clock. That is, the word line BWL is asserted at time t2 after a given delay made by internal circuitry from a rise of the clock BCLK and negated at time t4 after another given delay made by internal circuitry. The BWL is asserted at time t2 in sync with a fall of the clock BCLK and negated at time t4 in sync with a rise of the clock BCLK.

In the PUF-ID generation mode, the clock for PUF-ID generation IDCLK and this clock is supplied via the switches 21-1 and 21_2 as the internal clocks intACLK and intBCLK. For a period from time t5 to t8, the waveforms of both the internal clocks intACLK and intBCLK become the same as the waveform of the clock for PUF-ID generation IDCLK. The two word lines AWL and BWL are simultaneously asserted at time t7 after a given delay made by internal circuitry from a rise (time t6) of the clock for PUF-ID generation IDCLK and the internal clocks intACLK and intBCLK and simultaneously negated at time t8 after a given delay from the time t7. Accordingly, it is possible to easily synchronize timing to negate the two word lines AWL and BWL.

After time t9, the memory returns to the normal operation mode again. The normal operation clock ACLK is supplied as the internal clock intACLK and word line AWL makes a transition in sync with this clock. That is, the AWL is asserted at time t11 in sync with a rise of the clock ACLK and negated at time t13 after a given delay from the time t11. The normal operation clock BCLK is supplied as the internal clock intBCLK and the word line BWL makes a transition in sync with this clock. That is, the BWL is asserted at time t12 in sync with a rise of the clock BCLK and negated at time t14 after a given delay from the time t12.

In the way described above, synchronizing timing to negate two word lines AWL and BWL can be performed easily to generate a PUF-ID in a multi-port memory in which the respective ports operate in sync with mutually asynchronous clocks.

Figure 6:
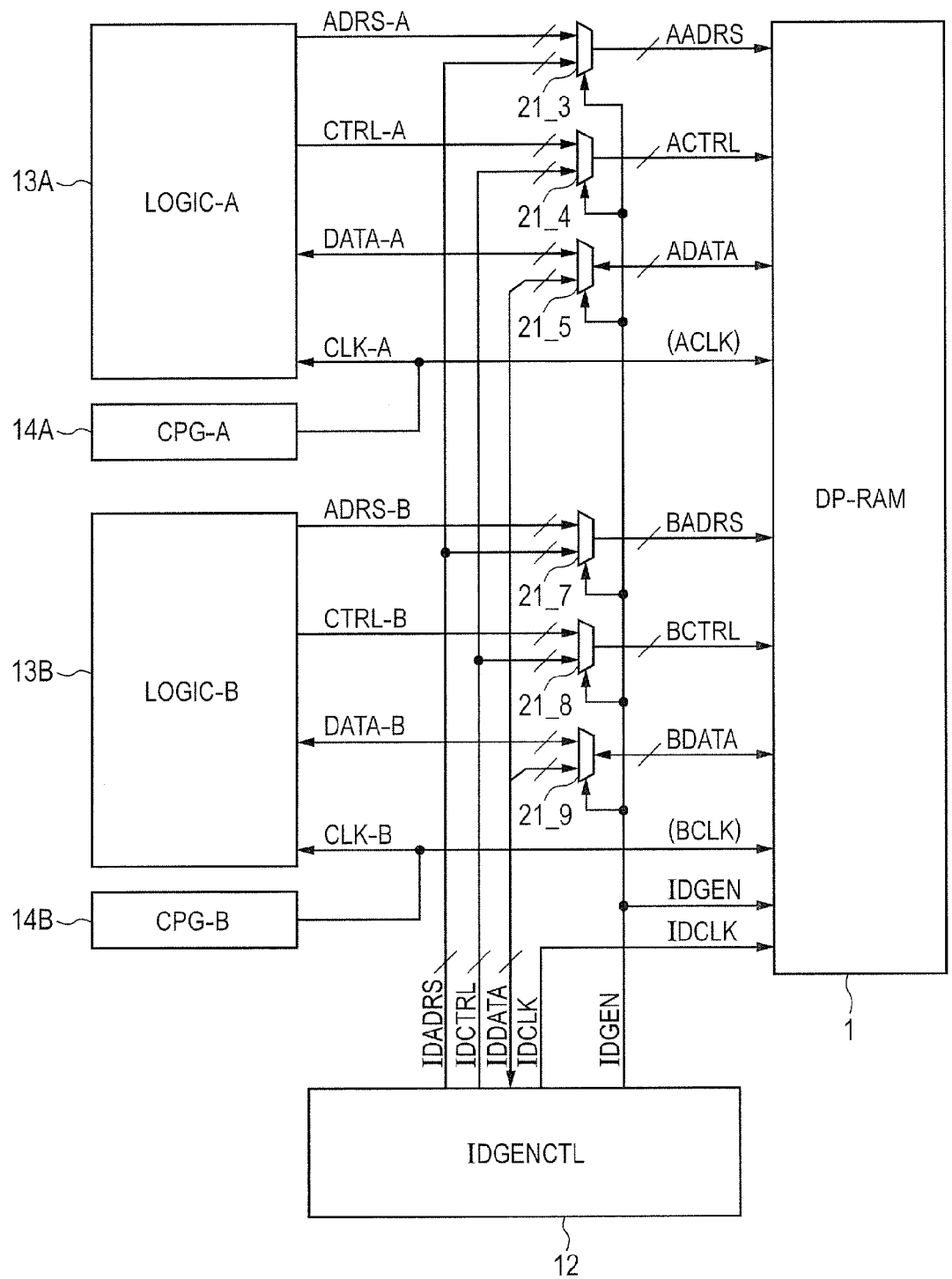
FIG. 6 is a block diagram representing an example of use of the semiconductor memory pertaining to the second embodiment.

FIG. 6 is a block diagram representing an example of use of the semiconductor memory 1 pertaining to the second embodiment. To the semiconductor memory 1, the following are coupled: logic circuits for normal operation (LOGIC-A and LOGIC-B) 13A and 13B, clock generating circuits for normal operation (CPG-A and CPG-B) 14A and 14B, a PUF-ID generation controller (IDGENCTL) 12, and selectors 21_3 thru 21_5 and 21_7 thru 21_9. The selectors 21_3 thru 21_5 and 21_7 thru 21_9 may be integrated within the semiconductor memory 1 like the clock selectors 21_1 and 21_2. Although not restricted, the PUF-ID generation controller (IDGENCTL) 12 is configured by, e.g., a CPU (Central Processing Unit).

A logic circuit for normal operation (LOGIC-A) 13A operates in sync with a clock CLK-A which is supplied from a clock generating circuit (CPG-A) 14A, outputs an address ADRS-A and a control signal CTRL-A, and accesses the port A of the semiconductor memory 1 in the normal operation mode. A logic circuit (LOGIC-B) 13B operates in sync with a clock CLK-B which is supplied from a clock generating circuit (CPG-B) 14B, outputs an address ADRS-B and a control signal CTRL-B, and accesses the port B of the semiconductor memory 1 in the normal operation mode.

The PUF-ID generation controller (IDGENCTL) 12 outputs a PUF-ID generate command signal IDGEN, controls the selectors 21_3 thru 21_5 and 21_7 thru 21_9, and supplies a signal to generate a PUF-ID to the semiconductor memory 1 during a PUF-ID generation mode period. The PUF-ID generation controller supplies an identical address IDADRS onto address AADRS and BADRS lines. It also supplies an identical control signal IDCTRL onto control signal ACTRL and BCTRL lines and supplies two pieces of data, one having bits and the other having their inverse bits, onto data ADATA ad BDATA lines from its IDDATA terminal. Accordingly, different values are simultaneously written to a memory cell at the same address from the port A and the port B. At this time, control is exerted on two word lines AWL and BWL to synchronize timing to negate these word lines, as described previously. Because a PUF-ID which is a device-specific bit string is generated in the memory cells, the PUF-ID generation controller (ID-GENCTL) 12 reads its value through the use of one of the two ports.

In the way described above, it is possible to provide a semiconductor memory capable of stably generating a PUF-ID without having to be powered on/off under control. Because the power of the semiconductor memory 1 remains on even when a mode transition is made between the normal operation mode and the PUF-ID generation mode, data at addresses other than addresses that are accessed for generating a PUF-ID is retained. Data at the addresses that are accessed for generating a PUF-ID may be saved to another memory area before transition to the PUF-ID generation mode and reverted after return to the normal operation mode from the PUF-ID generation mode.

Third Embodiment

Short-Circuiting Two Word Lines

The second embodiment is an embodiment based on the assumption that the semiconductor memory 1 is configured with synchronous circuits that operate in synch with a clock that is input to each port. However, if a design is made so that timings to assert and negate the word lines are defined by a delay made by internal circuitry, as described above, synchronous operation may not always be attained because of process variation. While an absolute variation of process variation causes no problem, a relative variation may result in failure of synchronous operation. Regardless of whether the operation of a timing generating circuit for word lines is synchronous or asynchronous with a clock, a semiconductor memory of a third embodiment is configured to mutually short-circuit two word lines for generating a PUF-ID, thereby synchronizing timing to negate these word lines.

Figure 7:
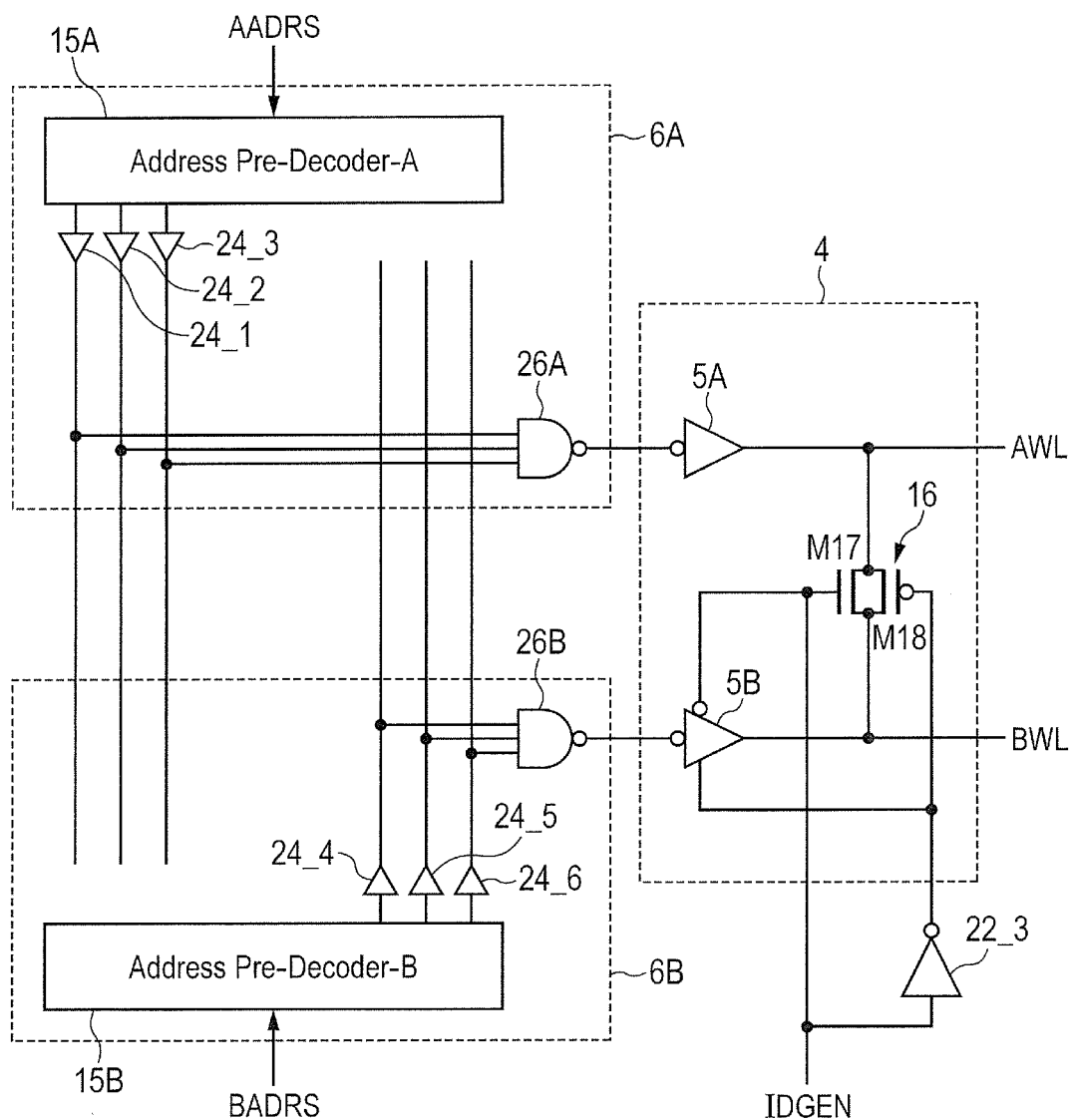
FIG. 7 is a partial circuit diagram depicting a configuration example of a semiconductor memory pertaining to a third embodiment.

FIG. 7 is a partial circuit diagram depicting a configuration example of a semiconductor memory 1 pertaining to the third embodiment.

Depicted here are some parts of the internal circuitry configurations of the controllers (CTRL-A and CTRL-B) 6A and 6B and the word line driver (WLD) 4 of the semiconductor memory 1 depicted in FIG. 1 or FIG. 4. The controller (CTRL-A) 6A is configured including an address pre-decoder 15A and a post-decoder 26A and an address AADRS is input thereto. The address AADRS may be an address that is input directly from outside of the semiconductor memory 1 or an address that is once latched and synchronized with a clock. If the address AADRS is comprised of eight bits, the pre-decoder 15A, for example, fully decodes its upper four bits and lower four bits respectively and generates upper 16+lower 16 decode outputs which are output through respective output lines. Alternatively, it may decode the upper and lower four bits respectively into 16 outputs of positive logic decoding and 16 outputs of negative logic decoding; i.e., a total of 64 decoding results may be output through respective output lines. The post-decoder is comprised of, e.g., 256 NAND gates, each of which is coupled to one of the upper 16 or positive and negative 32 decode output lines, one of the lower 16 or positive and negative 32 decode output lines, and an assertion timing control signal line. When the inputs through all of these lines are 0, the NAND gate asserts the word line AWL. Upper 16+lower 16 decode outputs and an assertion timing control signal are driven by buffers 24_1 thru 24_3 respectively. As the depicted post-decoder 26A, one of the 256 NAND gates is depicted representatively. Other NAND gates, decode output signal lines, and control signal lines are omitted from depiction. The controller (CTRL-B) 6B at the port B side can also be configured likewise and, thus, description thereof is omitted.

Any circuitry configuration of the controller may be possible, not limited to the form in which the pre-decoder is combined with the post-decoder. The number of bits constituting an address does not always need to be the same for the port A side and the port B side and does not need to be power of two.

The word line driver (WLD) 4 is configured including a word line driving circuit 5A to drive the word line AWL, a word line driving circuit 5B to drive the word line BWL, and a switch 16 to short-circuit the word lines AWL and BWL. Word line drivers may be provided for all pairs or a subset of pairs of word lines coupled to the port A and coupled to the port B. The word line driving circuit 5A for a word line coupled to the port A is configured by an inverter and the word line driving circuit 5B for a word line coupled to the port B is configured by a clocked inverter. The switch 16 is configured by coupling an n-channel MOSFET 17 and a p-channel MOSFET 18 in parallel. When the PUF-ID generate command signal IDGEN is asserted, the output of the word line driving circuit 5B becomes high impedance and the switch 16 closes (turns on). It follows that both the word lines AWL and BWL are driven by the word line driving circuit 5A for a word line coupled to the port A. Accordingly, both the word lines AWL and BWL depend on only the address AADRS that is input to the port A side and asserted and negated simultaneously.

In the way described above, synchronizing timing to negate two word lines (AWL and BWL) can be performed easily and surely to generate a PUF-ID in a multi-port memory in which the respective ports operate independently from each other.

Figure 8:
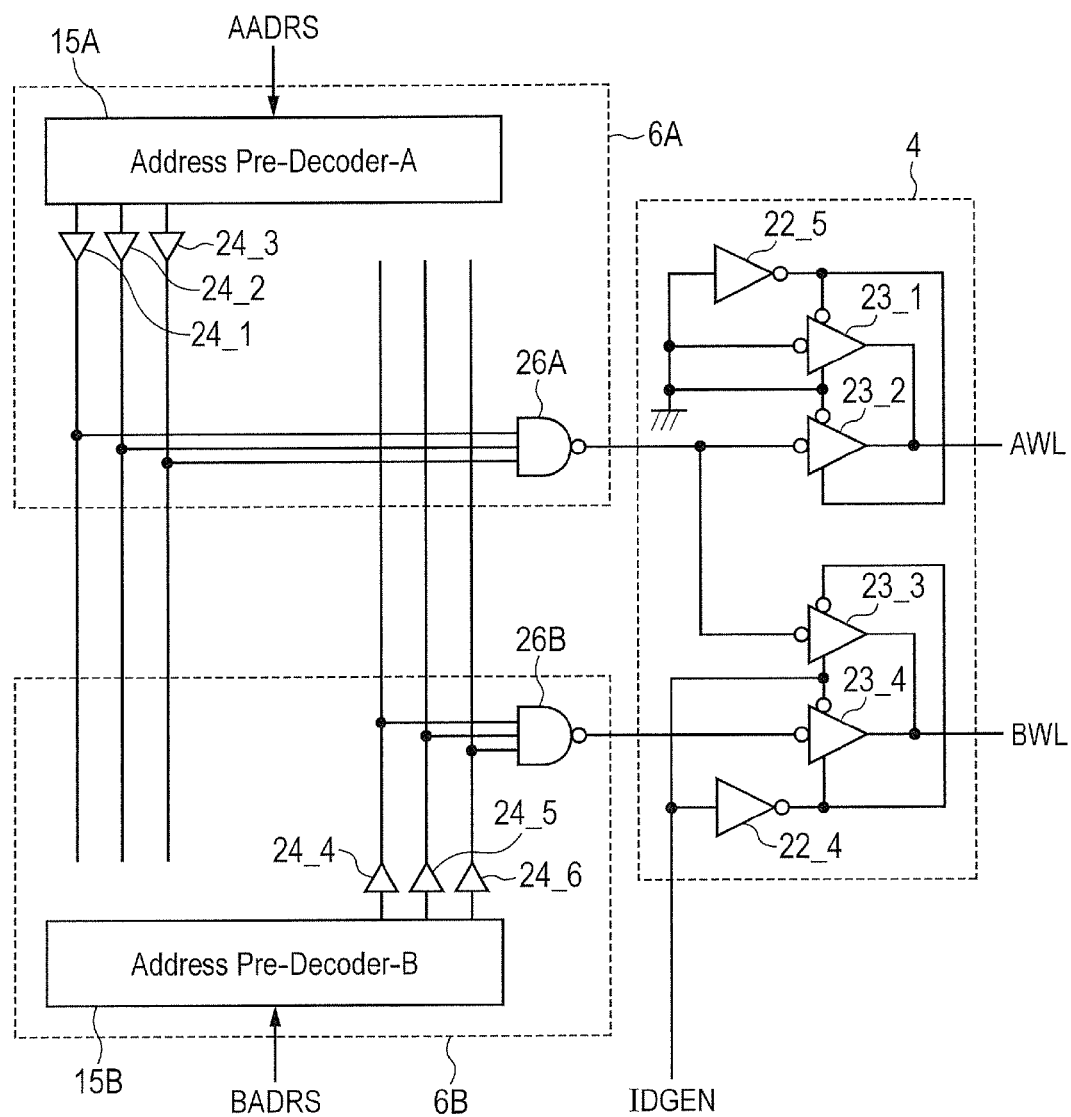
FIG. 8 is a partial circuit diagram depicting another configuration example of the semiconductor memory pertaining to the third embodiment.

FIG. 8 is a partial circuit diagram depicting another configuration example of the semiconductor memory 1 pertaining to the third embodiment.

As is the case for FIG. 7, depicted here are some parts of the internal circuitry configurations of the controllers (CTRL-A and CTRL-B) 6A and 6B and the word line driver (WLD) 4 of the semiconductor memory 1 depicted in FIG. 1 or FIG. 4. Because the controllers (CTRL-A and CTRL-B) 6A and 6B can be configured in the same way as in FIG. 7, their description is omitted.

The word line driver (WLD) 4 is configured by using four clocked inverters 23_1 thru 23_4 for a pair of word lines AWL and BWL. The output of the post-decoder 26A to drive the word line AWL from the port A side is input to clocked inverters 23_2 and 23_3. The output of the post-decoder 26B to drive the word line BWL from the port B side is input to a clocked inverter 23_4. The outputs of the clocked inverters 23_1 and 23_2 are coupled to the word line AWL and the outputs of the clocked inverters 23_3 and 23_4 are coupled to the word line BWL.

For the clocked inverter 23_1, its positive clock terminal is grounded and its negative clock terminal is fixed to a high level inverted by an inverter 22_5, so that the clocked inverter 23_1 always outputs high impedance. For the clocked inverter 23_2, oppositely, its negative clock terminal is grounded and its positive clock terminal is fixed to a high level inverted by the inverter 22_5, so that the clocked inverter 23_2 always inverts a signal that is input from the post-decoder 26A and outputs it to the word line AWL.

The operations of the clocked inverters provided to drive the word line BWL are switched by operation mode. When the PUF-ID generate command signal IDGEN is low, i.e., in the normal operation mode, the clocked inverter 23_3 outputs high impedance and the clocked inverter 23_4 inverts a signal that is input from the post decoder 26B and outputs it to the word line BWL. When the PUF-ID generate command signal IDGEN is high, i.e., in the PUF-ID generation mode, the clocked inverter 23_4 outputs high impedance and clocked inverter 23_3 inverts a signal that is input from the post-decoder 26A at the port A side and outputs it to the word line BWL. Thus, in the PUF-ID generation mode, both the word lines AWL and BWL are driven by an inverse signal to the signal that is input from the post-decoder 26A at the port A side. Accordingly, both the word lines AWL and BWL depend on only the address AADRS that is input to the port A side and asserted and negated simultaneously.

In the way described above, synchronizing timing to negate two word lines (AWL and BWL) can be performed easily and surely to generate a PUF-ID in a multi-port memory in which the respective ports operate independently from each other.

If the negative clock terminal of the clocked inverter 23_1 and the positive clock terminal of the clocked inverter 23_2 are coupled to the line of a high fixed signal in power supply wiring or the like, the inverter 22_5 can be dispensed with. It may also be possible that the clocked inverter 23_1 is removed and the clocked inverter 23_2 is replaced by a simple inverter. This can allows for a reduction in the circuit size of the word line driver 4. The effect of such reduction in the circuit size is significant, because the number of word lines is on the order of several hundreds. However, by configuring the WLD as depicted in FIG. 8, synchronizing timing to negate two word lines (AWL and BWL) can be performed more accurately. The reason for this is as follow. In the WLD configuration depicted in FIG. 8, the drive circuits for driving the word lines AWL and BWL, namely, the clocked inverters 23_2 and 23_4 in the normal operation mode and the clocked inverters 23_2 and 23_3 in the PUF-ID generation mode are configured in exactly the same way and, additionally, the clocked inverter 23_1 that is always off is provided. This configuration can equalize the load capacitances of the word lines AWL and BWL.

Figure 9:
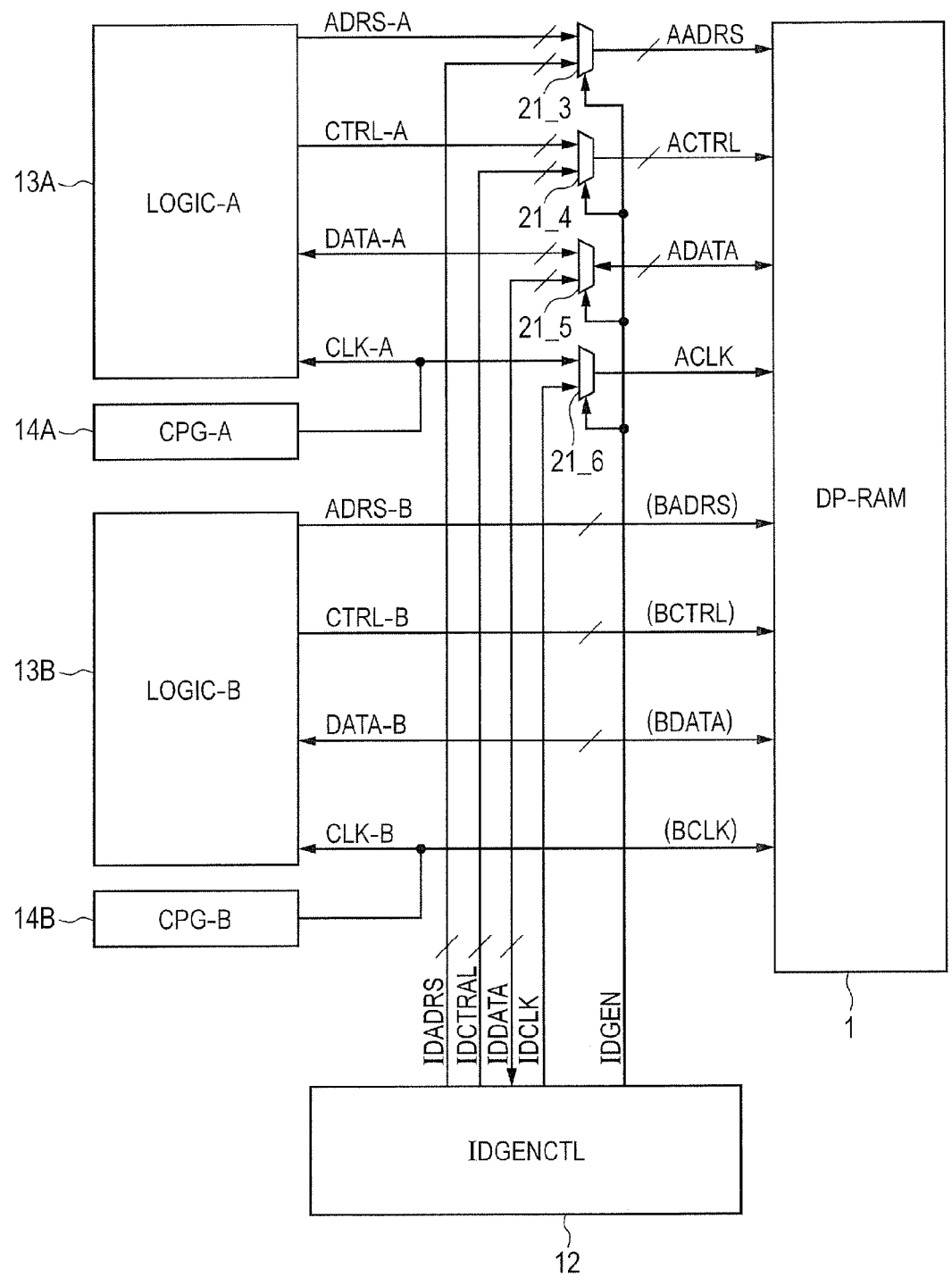
FIG. 9 is a block diagram representing an example of use of the semiconductor memory pertaining to the third embodiment.

FIG. 9 is a block diagram representing an example of use of the semiconductor memory 1 pertaining to the third embodiment. As is the case for FIG. 6, to the semiconductor memory 1, the following are coupled: logic circuits for normal operation (LOGIC-A and LOGIC-B) 13A and 13B, clock generating circuits for normal operation (CPG-A and CPG-B) 14A and 14B, and a PUF-ID generation controller (IDGENCTL) 12. Presented in FIG. 6 was an example in which the selectors 21_3 thru 21_5 are respectively coupled to the lines at the port A side and the selectors 21_7 thru 21_9 are coupled to the lines at the port B side, whereas, in FIG. 9, an example is presented in which selectors 21_3 thru 21_6 are respectively coupled to the lines of address AADRS, control signal ACTRL, data DATA, and clock ACLK at the port A side, but no selectors are provided at the port B side. The selectors 21_3 thru 21_6 may be integrated within the semiconductor memory 1. Other circuit configurations and operations in the normal operation mode are the same as in the second embodiment described with reference to FIG. 6 and, thus, description thereof is omitted.

During a PUF-ID generation mode period, the PUF-ID generation controller (IDGENCTL) 12 outputs a PUF-ID generate command signal IDGEN, controls the selectors 21_3 thru 21_6, and supplies a signal to generate a PUF-ID to the semiconductor memory 1. And it supplies an address IDADRS onto an address AADRS line, a control signal IDCTRL onto a control signal ACTRL line, and IDDATA onto a data ADATA line, respectively. In each of the configuration examples depicted in FIGS. 7 and 8, in the PUF-ID generation mode, the word lines AWL and BWL are asserted depending on the address AADRS that is input to the port A side. Through the selector coupled to the address line at the port A side, as mentioned above, the address IDADRS is supplied to the port A side of the semiconductor memory 1 and word lines to be accessed are determined depending on the address IDADRS. Although data inputs are omitted from depiction in FIGS. 7 and 8, it may be implemented to invert all bits of data ADATA that is input to the port A side and use the resulting data to replace data BDATA to the port B side. Thereby, it is possible to supply different pieces of write data to a same memory cell, without generating inverted bit data by an external device (e.g., the PUF-ID generation controller) and supplying that data via the port B. Accordingly, different values are simultaneously written to a memory cell at the same address from the port A and the port B. At this time, control is exerted on two word lines AWL and BWL to synchronize timing to negate these word lines, as described previously. Because a PUF-ID which is a device-specific bit string is generated in the memory cells, the PUF-ID generation controller (IDGENCTL) 12 reads its value through the use of one of the two ports.

In the way described above, it is possible to provide a semiconductor memory capable of stably generating a PUF-ID without having to be powered on/off under control. It is also feasible to carry out the third embodiment in combination with a part or all of the foregoing second embodiment and fourth and fifth embodiments which will be described later.

Fourth Embodiment

Address Decode Signal Switching

Figure 10:
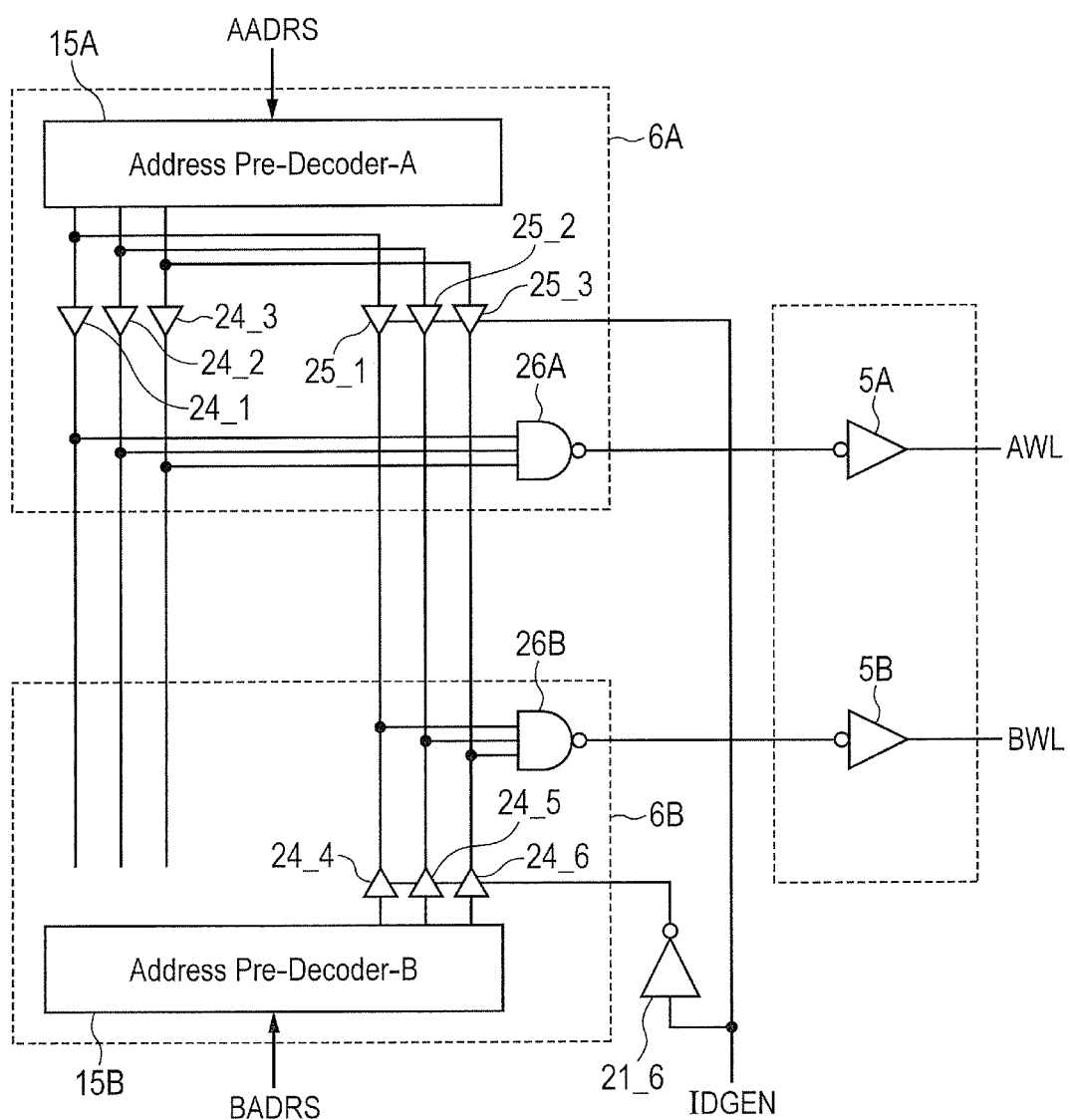
FIG. 10 is a partial circuit diagram depicting a configuration example of a semiconductor memory pertaining to a fourth embodiment.

FIG. 10 is a partial circuit diagram depicting a configuration example of a semiconductor memory 1 pertaining to a fourth embodiment.

As is the case for FIG. 7, depicted here are some parts of the internal circuitry configurations of the controllers (CTRL-A and CTRL-B) 6A and 6B and the word line driver (WLD) 4 of the semiconductor memory 1 depicted in FIG. 1 or FIG. 4. In the controller (CTRL-B) 6B at the port B side, the buffers 24_4 thru 24_6 are replaced by clocked buffers (tristate buffers) 25_4 thru 25_6. In the controller (CTRL-A) 6A at the port A side, tristate buffers 25_1 thru 25_3 are added and they are coupled to the lines of pre-decoding results to which the tristate buffers 25_4 thru 25_6 are also coupled. The tristate buffers 25_1 thru 25_3 and the tristate buffers 25_4 thru 25_6 are exclusively controlled with the PUF-ID generate command signal IDGEN. When the PUF-ID generate command signal IDGEN is low, i.e., in the normal operation mode, the tristate buffers 25_1 thru 25_3 output high impedance and the tristate buffers 25_4 thru 25_6 output pre-decoding results of the address pre-decoder 15B at the port B side to the post-decoder 26B. The word line BWL is asserted depending on the address BADRS that is input to the port B side. When the PUF-ID generate command signal IDGEN is high, i.e., in the PUF-ID generation mode, the tristate buffers 25_4 thru 25_6 output high impedance and the tristate buffers 25_1 thru 25_3 output pre-decoding results of the address pre-decoder 15A at the port Aside to the post-decoder 26B at the port B side. Because, at the same time, the pre-decoding results of the address pre-decoder 15A at the port A side are also output to the post-decoder 26A at the port A side, both the word lines AWL and BWL are asserted depending on the address AADRS that is input to the port A side in the PUF-ID generation mode. Accordingly, both the word lines AWL and BWL depend on only the address AADRS that is input to the port A side and asserted and negated simultaneously.

In the way described above, synchronizing timing to negate two word lines (AWL and BWL) can be performed easily and surely to generate a PUF-ID in a multi-port memory in which the respective ports operate independently from each other.

For the embodiment depicted in FIGS. 7 and 8, additional circuits are needed for all word lines, because of the configuration for short-circuiting each pair of word lines, whereas the embodiment makes it possible to accurately match the analog characteristics of a pair of word lines and, thus, to synchronize timing to negate the word lines more accurately. By contrast, for the present embodiment depicted in FIG. 10, additional circuits are not needed for all word lines and circuits for supplying pre-decoding results only have to be added and, thus, this embodiment can be carried out in a relatively small circuit size.

Fifth Embodiment

Automatically Generating Write Data

In the second through fourth embodiments described above, presented was an example of generating and inputting two pieces of data, one having bits and the other having their inverse bits, in order to write different pieces of data to a same memory cell. In a fifth embodiment, a circuitry for automatically generating different pieces of data to be written to a same memory cell, internally to the semiconductor memory 1, is described.

Figure 11:
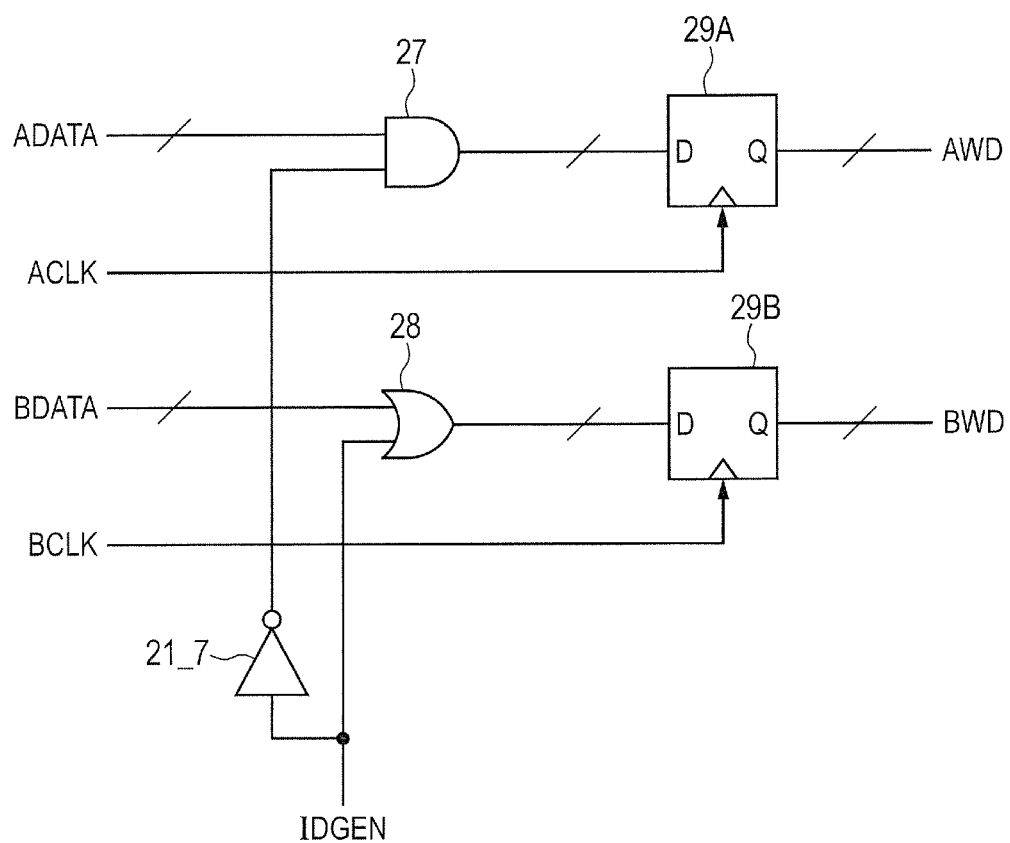
FIG. 11 is a partial circuit diagram depicting a configuration example of a semiconductor memory pertaining to a fifth embodiment.

FIG. 11 is a partial circuit diagram depicting a configuration example of a semiconductor memory 1 pertaining to the fifth embodiment. At the port A side, data ADATA is input, passes through an AND gate 27, latched by a flip-flop 29A that synchronizes with the clock ACLK, and output as write data AWD from the port A side. At the port B side, data BDATA is input, passes through an OR gate 28, latched by a flip-flop 29B that synchronizes with the clock BCLK, and output as write data BWD from the port B side. Although the AND gate 27, flip-flop 29A, OR gate 28, and flip-flop 29B are depicted as single ones respectively, they are provided as many as the number of bits of ADATA and BDATA. To the OR gate 28, a PUF-ID generate command signal IDGEN is input. To the AND GATE 27, an inverse signal to the PUF-ID generate command signal IDGEN, inverted through an inverter 21_7, is input. When the PUF-ID generate command signal IDGEN is low in the normal operation mode, ADATA and BDATA are input to and latched by the flip-flops 29A and 29B without change. When the PUF-ID generate command signal IDGEN is high in the PUF-ID generation mode, all bits of ADATA are forced to 0 by the AND gate 27 and data with all bits being 0 is latched by the flip-flop 29A, whereas all bits of BDATA are forced to 1 by the OR gate 28 and data with all bits being 1 is latched by the flip-flop 29B. In the PUF-ID generation mode, write data WAD with all bits being 0 is supplied from the port A side and write data BWD with all bits being 1 is supplied from the port B side.

In this way, it is possible to automatically generate different pieces of data to be written to a same memory cell, internally to the semiconductor memory 1.

Figure 12:
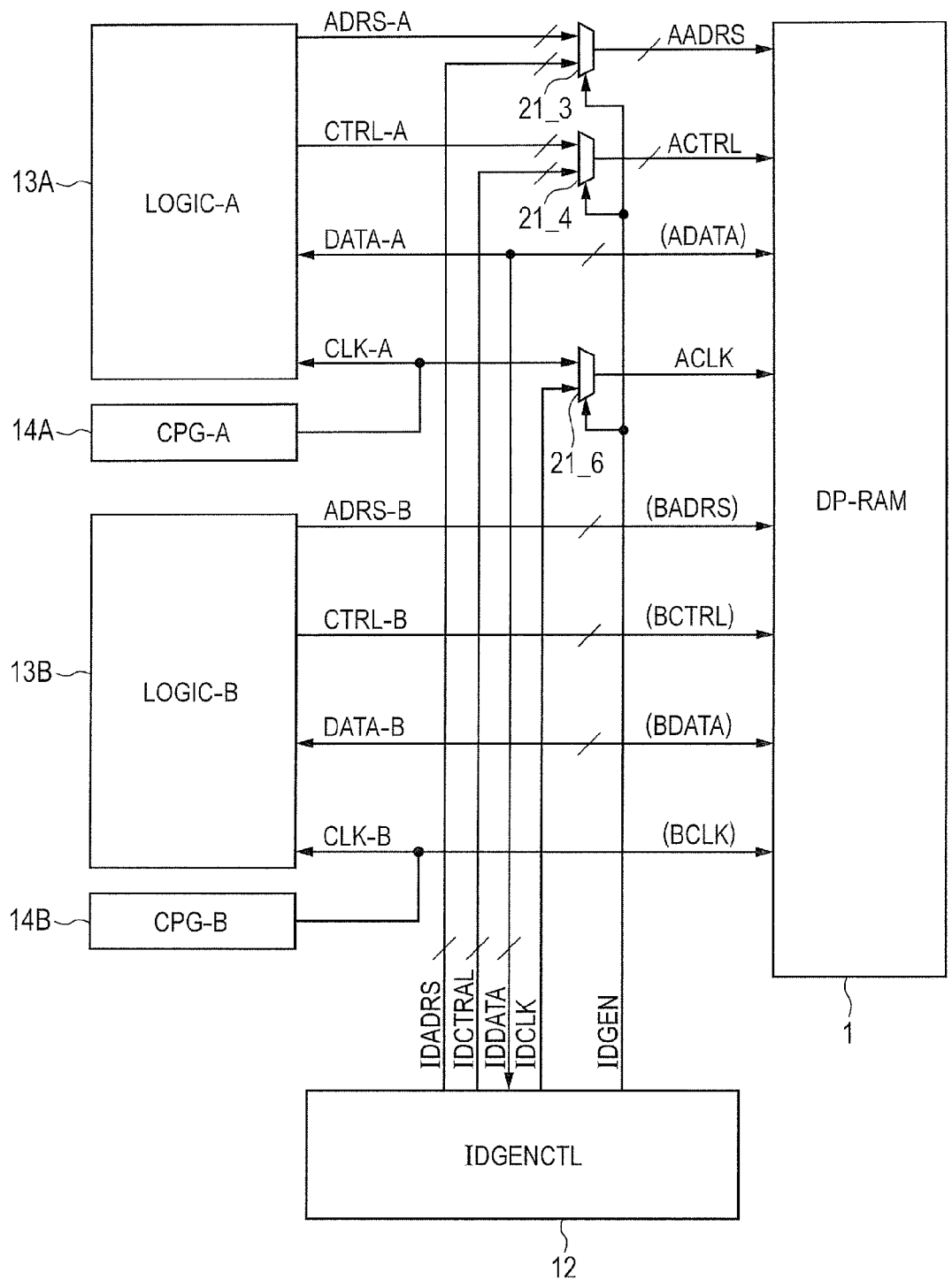
FIG. 12 is a block diagram representing an example of use of the semiconductor memory pertaining to the fifth embodiment.

FIG. 12 is a block diagram representing an example of use of the semiconductor memory 1 pertaining to the fifth embodiment. As is the case for FIG. 6 and FIG. 9, to the semiconductor memory 1, the following are coupled: logic circuits for normal operation (LOGIC-A and LOGIC-B) 13A and 13B, clock generating circuits for normal operation (CPG-A and CPG-B) 14A and 14B, a PUF-ID generation controller (IDGENCTL) 12. Presented in FIG. 6 was an example in which the selectors 21_3 thru 21_5 are provided at the port A side and the selectors 21_7 thru 21_9 are provided at the port B side and presented in FIG. 9 was an example in which the lines of address AADRS, control signal ACTRL, data DATA, and clock ACLK at the port A side are provided with the selectors 21_3 thru 21_6 respectively, but no selectors are provided at the port B side, whereas, in FIG. 12, further, the selector 21_5 for data ADATA is dispensed with. This is because it is no longer needed to supply data IDDATA for generating a PUF-ID from the PUF-ID generation controller (IDGENCTL) 12, since such data is automatically generated by the circuitry depicted in FIG. 11, internally to the semiconductor memory 1. On the other hand, a PUF-ID generated in the semiconductor memory 1 is read through the ADATA line to the PUF-ID generation controller (IDGENCTL) 12. The selectors 21_3, 21_4, and 21_6 may be integrated within the semiconductor memory 1. Other circuit configurations and operations in the normal operation mode are the same as in the second and third embodiments described with reference to FIG. 6 and FIG. 9 and, thus, description thereof is omitted.

In the way described above, it is possible to provide a semiconductor memory capable of stably generating a PUF-ID without having to be powered on/off under control. It is also feasible to carry out the fifth embodiment in combination with a part or all of the foregoing second, third, and fourth embodiments.

While the invention made by the present inventors has been described specifically based on its embodiments hereinbefore, it will be obvious that the present invention is not limited to the described embodiments and various modifications may be made therein without departing from the scope of the invention.

For example, division into blocks depicted in the block diagrams is only illustrative and a change thereto may be made appropriately and optionally. One block may be changed to another block in such a way that a part or all of the functions of the one block may be merged with a function or functions of any other block.

What is claimed is:

1. A semiconductor memory comprising:
   a plurality of memory cells, each memory cell coupled to two or more word lines and two or more corresponding bit lines; and
   two or more ports, each port coupled to each memory cell, of the plurality of memory cells, via a respective one of the two or more words lines of the memory cell and a respective one of the two or more bit lines of the memory cell,
   control circuitry, configured to control the semiconductor memory in a plurality operation modes, including:

a normal operation mode, where contention for writing data to a memory cell of the plurality of memory cells is controlled such that only one of the two or more word lines for the memory cell is ON at a time; and a PUF-ID generation mode, where at least two of the two or more word lines of a memory cell of the plurality of memory cells are both asserted during a period of time, while the corresponding bit lines are set to values different from each other, and then simultaneously turned off, whereby the memory call stabilizes to a value based on device-specific variations.

2. The semiconductor memory according to claim 1, further comprising:

two or more normal operation clock, each respectively corresponding to one of the two or more write ports and a clock for PUF-ID generation, wherein the control circuitry is further configured such that:

in the normal operation mode, writing data to a memory cell of the plurality of memory cells is performed in sync with the normal operation clocks, and in the PUF-ID generation mode, the two word lines for a memory cell of the plurality of memory cells are controlled in sync with the clock for PUF-ID generation.

3. The semiconductor memory according to claim 1, wherein each of the two or more write ports are configured to receive an address signal and a control signal, and wherein the control circuitry is further configured such that:

in the normal operation mode, the two or more word lines are controlled separately depending on the address and control signals respectively received by the write ort corresponding to the word lines, and in the PUF-ID generation mode, the two or more word lines are controlled depending on the address and a control signals received by one of the write ports.

4. The semiconductor memory according to claim 3, further comprising a switch for mutually short-circuiting the two or more word lines in the PUF-ID generation mode.

5. The semiconductor memory according to claim 3, wherein each of two or more write ports to which the two or more word lines are coupled respectively include an address decoder for decoding an address received by the write port and a drive circuit for driving the corresponding word line depending on an output of the address decoder in the normal operation mode, and wherein the semiconductor memory further comprises switching circuits configured to replace an output of one the address decoders with an output of another of the address decoders in the PUF-ID generation mode.

6. The semiconductor memory according to claim 5, wherein each of the address decoders includes a pre-decoding circuit that decodes an input address and a post-decoding circuit that receives a pre-decoding result of the pre-decoding circuit and generates a signal to control one of the word lines, and wherein the switching circuits are further configured to enable transmission of the pre-decoding results to the corresponding post-decoding circuit in the normal operation mode and to both the corresponding post-decoding circuit and the post-decoding circuit of the address decoder of another write port, in the PUF-ID generation mode.

7. The semiconductor memory according to claim 1, wherein the write ports are each configured to receive respective write data, wherein the control circuitry is further configured to cause the write data to be written to the plurality of memory cells in the normal operation mode, and wherein the semiconductor memory further comprises a circuit for, in the PUF-ID generation mode, inputting bits and inverse bits respectively to two of the write ports, instead of the write data.

8. A semiconductor memory comprising:

a first port configured to receive a first address, a second port configured to receive a second address, a memory array comprising a plurality of memory cells, each of the memory cells including a first switch, a second switch, and a storage element and coupled to one of a first plurality of word lines, one of a second plurality of word lines, one of a first plurality of bit lines, and one of a second plurality of bit lines, wherein the first switch is configured to transfer a first signal from the first bit line to the storage element when the first word line is asserted and the second switch is configured to transfer a second signal from the second bit line to the storage element when the second word line is asserted, and control circuitry configured to operate the semiconductor memory in a PUF-ID generation mode where the first and second word lines coupled to a memory cell of the memory array are both asserted during a period of time, and then simultaneously turned off, whereby the memory call stabilizes to a value based on device-specific variations.

9. The semiconductor memory according to claim 8, wherein the control circuitry is configured to operate in the PUF-ID generation mode in response to a generate command signal.

10. The semiconductor memory according to claim 9, wherein the first port further includes a first clock, the second port further includes a second clock, and the semiconductor memory further includes a third clock, wherein the control circuitry is further configured such that:

when the generate command signal is not asserted, the first port operates in sync with the first clock and the second port operates in sync with the second clock, and when the generate command signal is asserted, both the first port and the second port operate in sync with the third clock.

11. The semiconductor memory according to claim 9, wherein the first port further comprises a first drive circuit and the second port further comprises a second drive circuit, wherein the control circuitry is further configured such that:

when the generate command signal is not asserted, the first word line is driven by the first drive circuit and the second word line is driven by the second drive circuit, and when the generate command signal is asserted, both the first word line and the second word line are driven by the first drive circuit.

12. The semiconductor memory according to claim 9, wherein the first port further comprises a first control circuit and a first drive circuit and the second port further comprises a second control circuit and a second drive circuit, wherein the control circuitry is further configured such that:

when the generate command signal is not asserted, the first control circuit supplies first decoding results of a decoding of the first address to the first drive circuit and the first drive circuit drives the first word line depending on the first decoding results, and the second control circuit supplies second decoding results of a decoding of the second address to the second drive circuit and the second drive circuit drives the second word line depending on the second decoding results, and when the generate command signal is asserted, the first control circuit supplies first decoding results of a decoding of the first address to the first drive circuit and the second drive circuit, the first drive circuit drives the first word line the depending on the first decoding results, and the second drive circuit drives the second word line depending on the first decoding results.

13. The semiconductor memory according to claim 12, wherein the first control circuit further comprises a first pre-decoding circuit that pre-decodes the first address and outputs first pre-decoding results and a first post-decoding circuit that drives the first drive circuit, and the second control circuit further comprises a second pre-decoding circuit that pre-decodes the second address and outputs second pre-decoding results and a second post-decoding circuit that drives the second drive circuit, wherein the control circuitry is further configured such that:

when the generate command signal is not asserted, the first pre-decoding results are supplied to the first post-decoding circuit and the second pre-decoding results are supplied to the second post-decoding circuit, and when the generate command signal is asserted, the first pre-decoding results are supplied to the first post-decoding circuit and the second post-decoding circuit.

14. The semiconductor memory according to claim 9, wherein the first port is configured to receive first write data and the second port is configured to receive second write data, and wherein the semiconductor memory further comprises a circuit configured to generate write data to fix the first write data to a string of predetermined bits and fix the second write data to a string of bits inverse to the values of bits of the string of predetermined bits, in the PUF-ID generation mode.

* * * * *